United States Patent
Kuo et al.

(10) Patent No.: US 8,552,785 B2
(45) Date of Patent: Oct. 8, 2013

(54) PULSE GENERATOR

(75) Inventors: Ming-Zhang Kuo, Xigang Shiang (TW); Jen-Hang Yang, Yonghe (TW); Shang-Chih Hsieh, Yangmei (TW); Chih-Chiang Chang, Zhudong Township, Hsinchu County (TW); Osamu Takahashi, Round Rock, TX (US); Ta-Pen Guo, Cupertino, CA (US); Sang Hoo Dong, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 153 days.

(21) Appl. No.: 13/292,124

(22) Filed: Nov. 9, 2011

(65) Prior Publication Data

US 2013/0113537 A1    May 9, 2013

(51) Int. Cl.
*G06F 1/04*    (2006.01)

(52) U.S. Cl.
USPC ............................................ 327/291; 327/293

(58) Field of Classification Search
USPC ......... 327/291, 293, 261, 263, 264, 269, 270, 327/272
See application file for complete search history.

(56) References Cited

U.S. PATENT DOCUMENTS 7,319,355 B2 *    1/2008    Wu et al. ........................ 327/291

* cited by examiner

*Primary Examiner* — Hai L Nguyen
(74) *Attorney, Agent, or Firm* — Duane Morris LLP

(57) ABSTRACT

A circuit includes a logic gate and a latch. The logic gate is configured to receive a clock signal at a first input. The latch is disposed in a feedback loop of the logic gate and is configured to output a feedback signal to a second input of the logic gate in response to a signal output by the logic gate and the clock signal. The circuit is configured to output a pulsed signal based on one of a rising edge or a falling edge of the clock signal.

19 Claims, 8 Drawing Sheets

PULSE GENERATOR

FIELD OF DISCLOSURE

The disclosure relates to integrated circuits. More specifically, the disclosure relates to circuits for generating pulsed output signals in response to a clock signal that may be incorporated into integrated circuits.

BACKGROUND

Mobile devices, such as music players, cell phones, computers, and the like, are ubiquitous, with many households owning more than one of such devices. These devices include one or more integrated circuits and use batteries as their power source. Efforts are continually made to reduce the size and power consumption of integrated circuits so that the overall size of the mobile devices may be scaled down, and so that users may use mobile devices for longer periods of time.

Many integrated circuits include pulse generators to generate timing pulses based on a rising or falling edge of a clock signal. However, these conventional pulse generators are susceptible to improper functioning in response to receiving an ill-defined clock signal, i.e., a clock signal having gradual slopes that define its pulse width, and to decreases in the operating voltages.

DETAILED DESCRIPTION

The pulse generation circuits disclosed herein operate at low voltages, e.g., less than 0.7 volts, and in response to receiving ill-defined clock signals, i.e., clock signals having moderate slopes that define the pulse width. In some embodiments, the pulse generation circuit includes a logic gate with a latch disposed in a feedback loop to provide a pulse signal, which may be inverted to provide an output signal that follows (i.e., has the same polarity as) an input clock signal.

Figure 1:
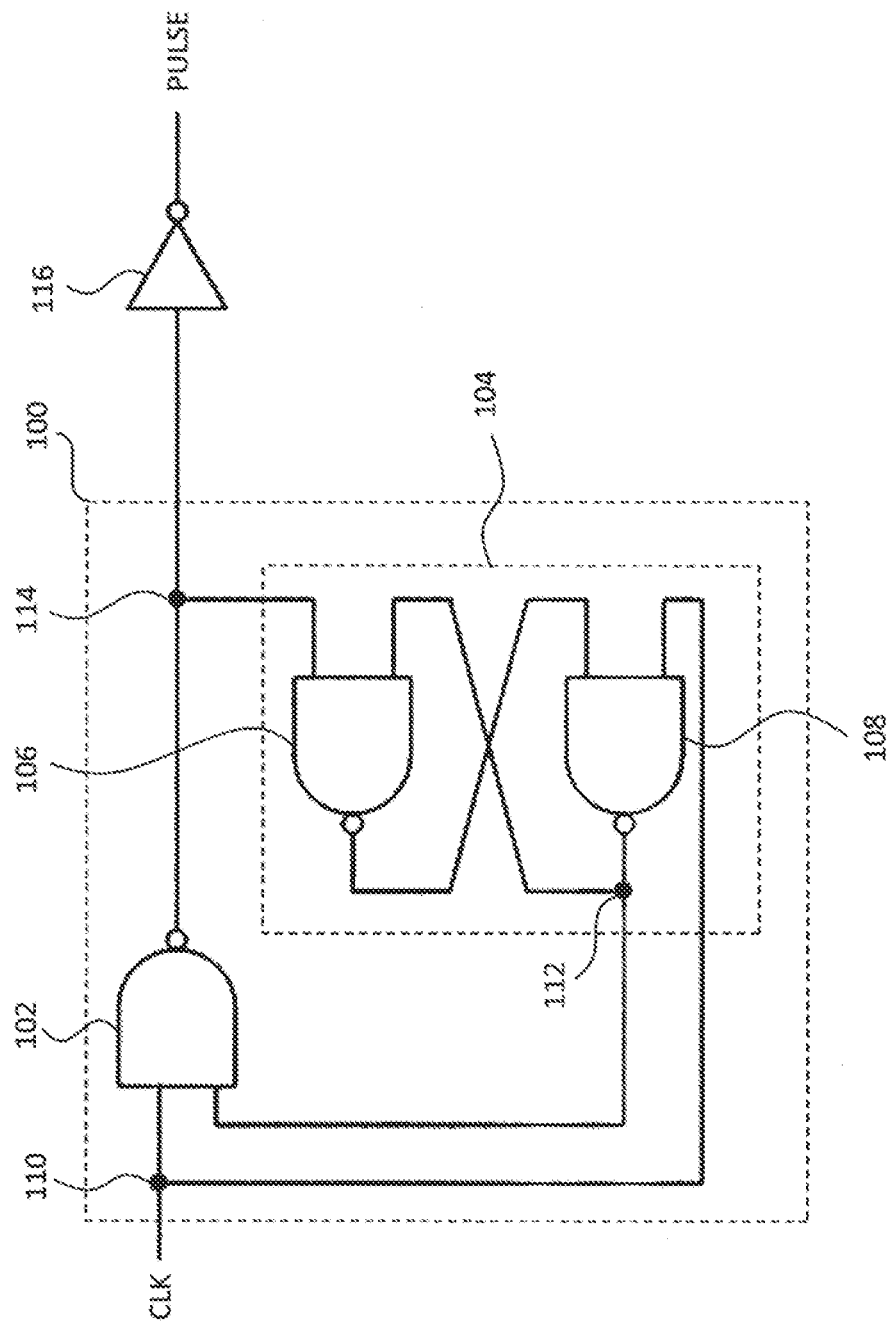
FIG. 1 illustrates one example of an improved pulse generation circuit.

FIG. 1 illustrates one example of an improved pulse generation circuit 100 configured to receive an input clock signal, CLK, and output a pulse signal in response to a rising edge of the CLK signal. Pulse generation circuit 100 includes a logic gate 102, which is illustrated as a NAND gate, and a latch 104. Latch 104 includes a pair of cross-coupled logic gates 106 and 108, which may be implemented as NAND gates as illustrated in FIG. 1.

Logic gate 102 has a first input coupled to node 110 and a second input coupled to node 112. Node 110 is coupled to an input of logic gate 108 of latch 104 and is configured to receive clock signal, CLK. Node 112 is coupled to the output of logic gate 108 and to the input of logic gate 106. The output of logic gate 102 is coupled to node 114, which may be used as an output of pulse generator 100 to provide a pulse signal, $V_{114}$, having an opposite polarity as that of the CLK signal. Node 114 is coupled to the input of logic gate 106 of latch and may be coupled to an optional inverter 116, which is configured to invert $V_{114}$ to provide a pulse signal, PULSE, that has the same polarity as the CLK signal.

Latch 104 is disposed in a feedback loop of logic gate 102 and includes logic gate 106 having a first input coupled to output node 114 and a second input coupled to node 112, which is also coupled to the output of logic gate 108. The output of logic gate 106 is coupled to an input of logic gate 108, which receives clock signal, CLK, at a second input as described above.

Figure 2:
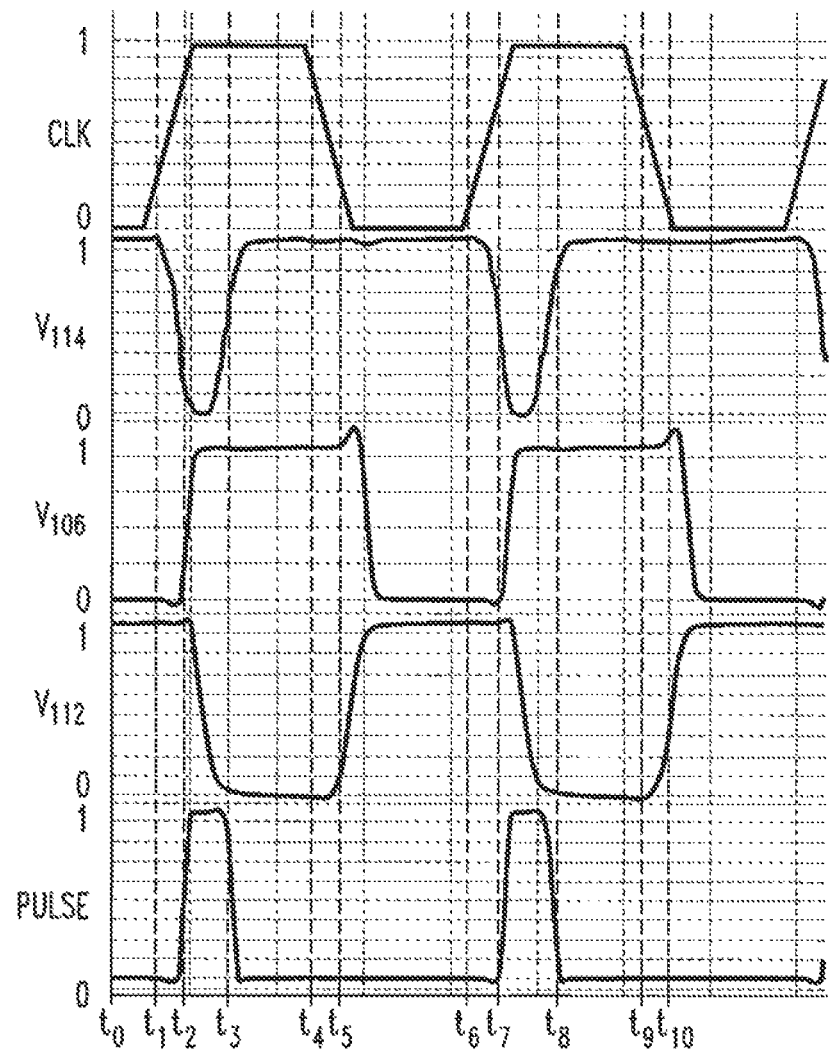
FIG. 2 is a timing diagram of various signals of the pulse generation circuit illustrated in FIG. 1.

The operation of pulse generator 100 is described with reference to FIGS. 1 and 2. As shown in FIG. 2, the CLK signal oscillates between a logic zero and a logic one. Initially at time $t_0$, CLK is a logic zero and $V_{114}$, which is coupled to the output of logic gate 102, is a logic one. As will be understood by one skilled in the art, NAND gates output logic zeroes when all of the input signals are logic ones and output logic ones for any other combination of inputs. With $V_{114}$ a logic one, the output of inverter 116, PULSE, is a logic zero. The voltage at node 112, $V_{112}$, which is coupled to the output of logic gate 108, is a logic one as both its inputs are logic zeroes. Specifically, logic gate 108 receives logic zeroes from the signal CLK and the output of logic gate 106. As described above, logic gate 106 outputs a signal, $V_{106}$, that is a logic zero when both its inputs are logic ones.

At time $t_1$, CLK transitions from a logic zero to a logic one. The transition of CLK from zero to one results causes logic gate 102 to change its output, $V_{114}$, from a logic one to a logic zero since logic gate 108 is still outputting a logic one to node 112. The logic zero at $V_{114}$ causes logic gate 106 to change its output, $V_{106}$, from a logic zero to a logic one and the PULSE signal to transition from a logic zero to a logic one at time $t_2$, which is a short time after $t_1$. The change in $V_{106}$ from a logic zero to a logic one in combination with CLK being a logic one results in logic gate 108 changing its output to node 112, $V_{112}$, from a logic one to a logic zero.

At time $t_3$, the CLK signal is a logic one, but the output of logic gate 102 transitions from a logic zero to a logic one in response to the logic zero output by logic gate 108 to node 112 at time $t_2$. The transition of $V_{114}$ from a logic zero to a logic one causes PULSE to transition from a logic one to a logic zero.

At time $t_4$, CLK transitions from a logic one to a logic zero. The respective outputs of logic gates 106 and 108, $V_{106}$ and $V_{112}$, are maintained from time $t_3$ until time $t_5$ when $V_{112}$ transitions from a logic zero to a logic one in response to CLK transitioning from a logic one to a logic zero at time $t_4$. As described above, logic gate 102 outputs a logic zero in response to receiving logic ones at both its inputs and outputs logic ones in response to all other combination of inputs. Accordingly, when CLK is a logic zero, logic gate 108 will output a logic one regardless of the voltage level of received from logic gate 106. The transitioning of $V_{112}$ from a logic zero to a logic one causes logic gate 106 to output a logic zero as the other input of logic gate 106, i.e., $V_{114}$, is a logic one.

At time $t_6$, CLK transitions from a logic zero to a logic one, which results in logic gate 102 transitioning from outputting a logic one to a logic zero at time $t_7$. Logic gate 102 outputs a logic zero to node 114 since both of inputs of logic gate 102 are logic ones. With $V_{114}$ at a logic zero, the PULSE signal transitions to a logic one as described above with respect to time $t_2$. The signals of CLK, PULSE, $V_{106}$, $V_{112}$, and $V_{114}$ transition in the manner at times $t_8$, $t_9$, and $t_{10}$ as they respectively transition at times $t_3$, $t_4$, and $t_5$. In this manner pulse generator 100 provides pulse signals $V_{114}$ and PULSE based on the CLK signal.

Figure 3:
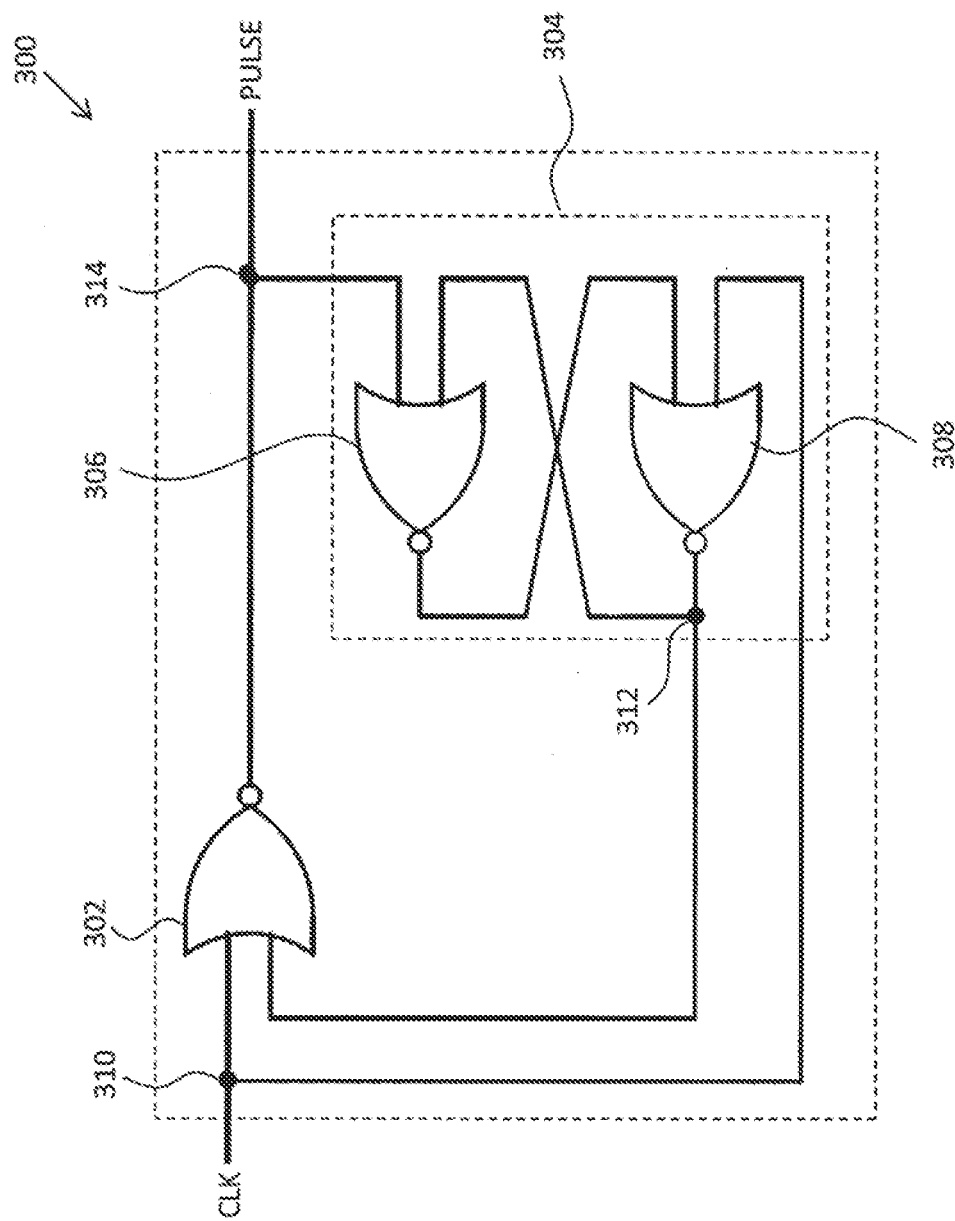
FIG. 3 illustrates another example of an improved pulse generator circuit.

Logic gates other than NAND gates may be used to create a pulse generator. For example, FIG. 3 illustrates another example of a pulse generator 300 configured to output a signal in response to a falling edge of a CLK signal that is implemented using NOR gates. As shown in FIG. 3, pulse generator 300 includes a NOR gate 302 configured to receive a clock signal, CLK, at a first input and a feedback signal from latch 304 at a second input. The output of NOR gate 302 is coupled to node 314, which serves as the output node of pulse generator 300.

Latch 304, which is disposed in a feedback loop of NOR gate 302, is coupled to node 314. Latch 304 includes NOR gate 306 having a first input coupled to node 314 and a second input coupled to node 312. The output of NOR gate 306 is coupled to an input of NOR gate 308, which has another input coupled to node 310 from which it receives clock signal CLK. The output of NOR gate 308 is coupled to node 312, which is coupled to an input of NOR gate 306 as described above and to an input of NOR gate 302.

Figure 4:
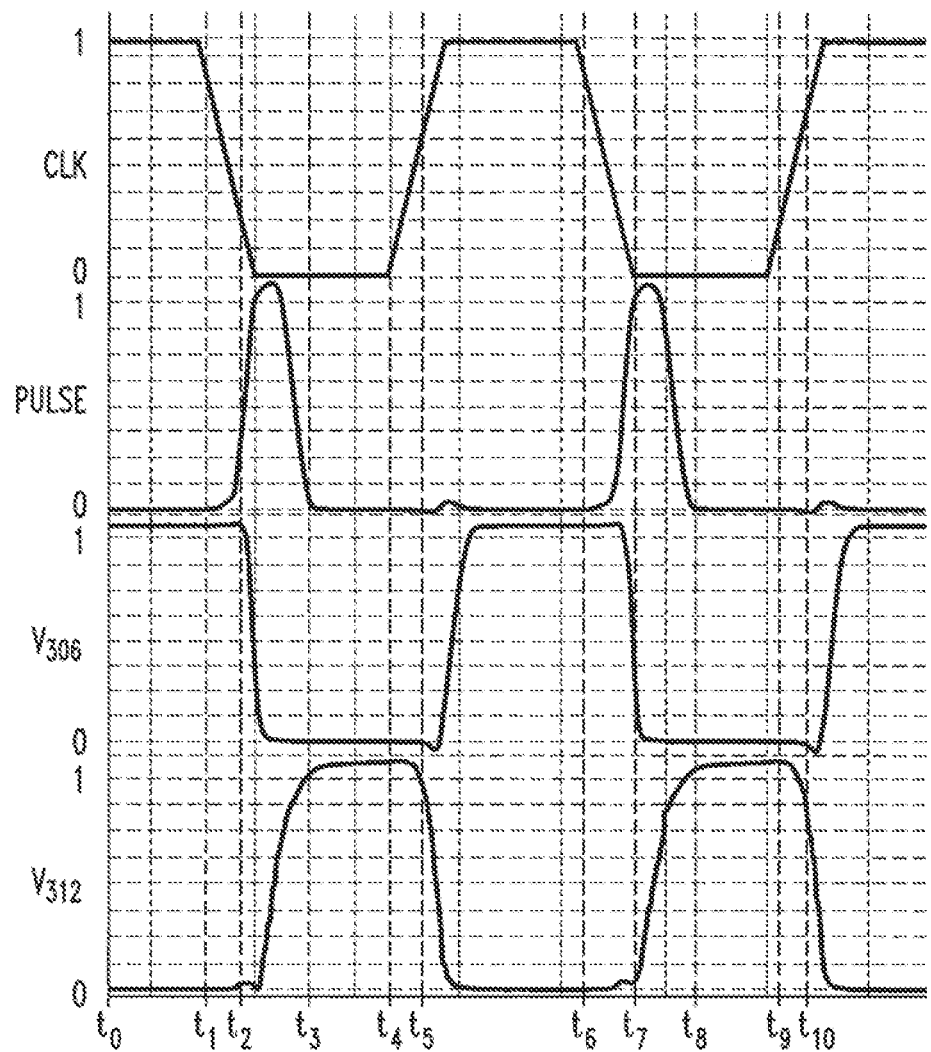
FIG. 4 is a timing diagram of various signals of the pulse generator circuit illustrated in FIG. 3.

The operation of pulse generator 300 is described with reference to FIGS. 3 and 4. As shown in FIG. 4, CLK and $V_{306}$ are logic ones and $V_{312}$ is logic zero at time $t_0$. Logic gate 302, which is a NOR gate, outputs a logic one when both inputs are logic zeroes and a logic one for any other combination of inputs. Accordingly, the output of logic gate 302, PULSE, is a logic zero at time $t_0$ as one input (CLK) is a logic one and the other input ($V_{312}$) is a logic zero.

At time $t_1$, CLK begins transitioning from a logic one to a logic zero, which results in PULSE transition from a logic zero to a logic one shortly thereafter at time $t_2$. PULSE is a logic one at time $t_2$ since both inputs of logic gate 302 are logic zeroes. With a logic one at node 314, which is equal to PULSE, the output of logic gate 306, $V_{306}$, transitions from a logic one to a logic zero as at least one of its inputs, i.e., PULSE, is a logic one. The logic zero at $V_{306}$ is provided to the input of logic gate 308, which increases the voltage at node, $V_{312}$, from a logic zero to a logic one in response to both of the inputs of logic gate 308 being logic zeroes.

The logic one at $V_{312}$ is provided to an input of logic gate 302 in addition to being provided to an input of logic gate 306. In response to receiving the logic one, the output of logic gate 302, PULSE, transitions from a logic one to a logic zero at time $t_3$. The other signals, e.g., CLK, $V_{3065}$ and $V_{312}$, do not change state at time $t_3$.

At time $t_4$, CLK begins to transition from a logic zero to a logic one, which does not affect the output of logic gate 302 since $V_{312}$, which is received at one of the inputs of logic gate 302, continues to be a logic one. However, the logic one of CLK is also provided to an input of logic gate 308, which begins to transition from a logic one to a logic zero in response to the change of CLK at time $t_5$ in response to receiving the logic one. The logic zero at node 312 is received at an input of logic gate 306. In response to receiving the logic zero from node 312, the output of logic gate 306, $V_{306}$, transitions from a logic zero to a logic one shortly after $t_5$.

At time $t_6$, CLK transitions from a logic one to a logic zero like CLK transitions from a logic one to a logic zero at time $t_1$. The transition of CLK from logic one to logic zero results in PULSE signal transitioning from a logic zero to a logic one at time $t_7$ due to logic gate 302 having logic zeroes at both of its inputs. The signals of CLK, PULSE, $V_{306}$, and $V_{312}$ transition in the manner at times $t_8$, $t_9$, and $t_{10}$ as they respectively transition at times $t_3$, $t_4$, and $t_5$. In this manner pulse generator 300 provides the PULSE signal based on the CLK signal.

The pulse generators illustrated in FIGS. 1 and 3 may be configured to modify or extend a pulse duration as well as to be selectively placed into a pulse mode (i.e., a mode in which the output of the pulse generator is different from the input clock signal) or non-pulse mode (i.e., a mode in which the output of the pulse generator follows the transition of the input clock signal).

The ability to have pulse and non-pulse modes is advantageous for debugging hardware by testing hardware at high and low frequencies. Additionally, the pulse and non-pulse modes enable the pulse generator circuit to be integrated with circuits that operate better with the input clock signal as well as the ability to use the pulse generator as a clock buffer to reduce circuit uncertainty due to potential process variations.

Figure 5:
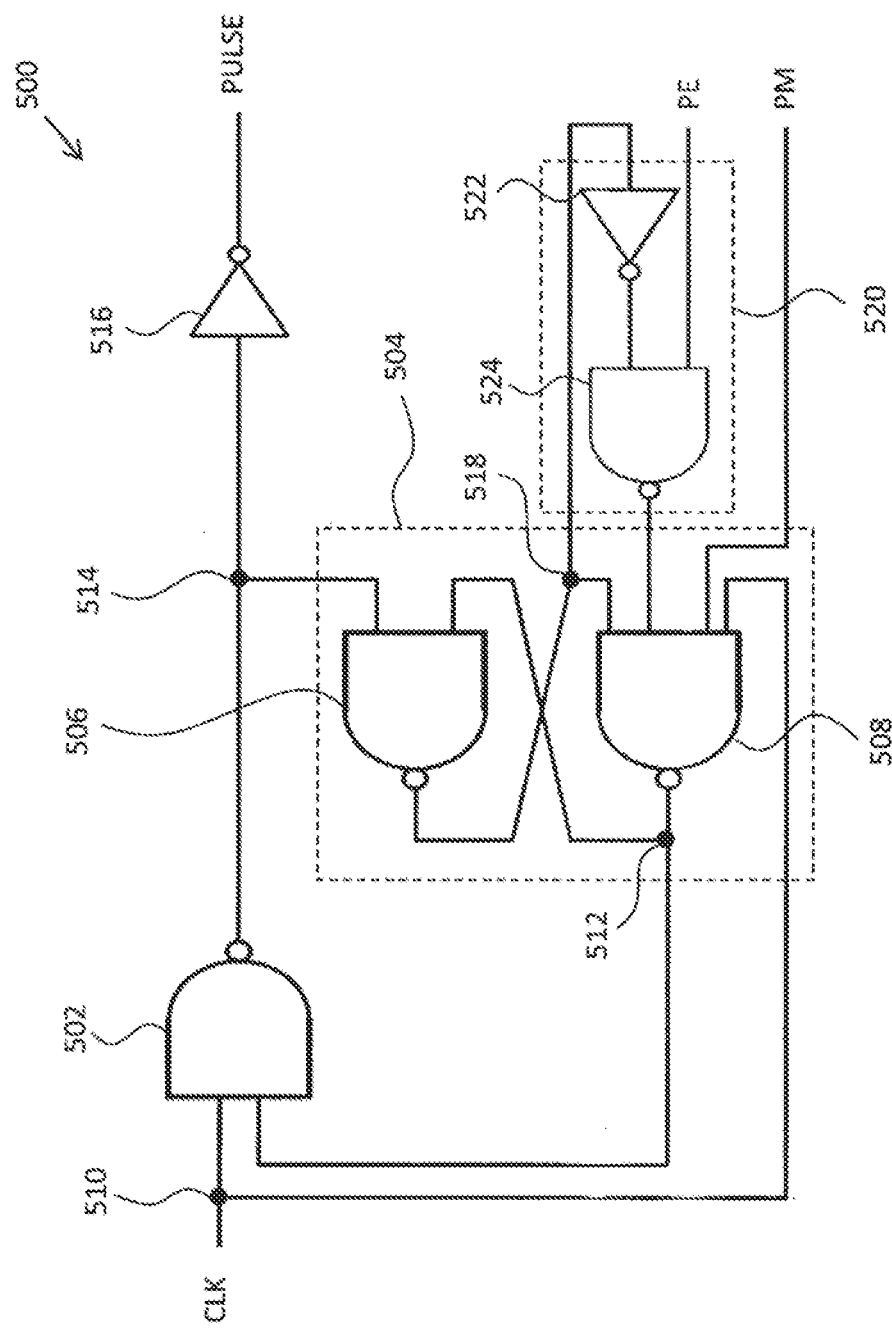
FIG. 5 illustrates another example of an improved pulse generator circuit.

FIG. 5 illustrates one example of a pulse generator circuit 500 having pulse/non-pulse modes and configured to extend a pulse width of the output pulse. As shown in FIG. 5, pulse generator 500 includes a logic gate 502, which is illustrated as a NAND gate, and a latch 504. Latch 104 includes a pair of cross-coupled logic gates 506 and 508, which may be implemented as NAND gates as shown in FIG. 5.

Logic gate 502 has a first input coupled to node 510 and a second input coupled to node 512. Node 510 is coupled to an input of logic gate 508 of latch 504 and is configured to receive clock signal, CLK. Node 512 is coupled to the output of logic gate 508 and to the input of logic gate 506. The output of logic gate 502 is coupled to node 514, which may be used as an output of pulse generator 500 to provide a pulse signal, $V_{514}$, having an opposite polarity to that of the CLK signal. Node 514 is coupled to the input of logic gate 506 of latch and may be coupled to an optional inverter 516, which is configured to invert $V_{514}$ to provide a pulse signal, PULSE, that has the same polarity as the CLK signal.

Latch 504 is disposed in a feedback loop of logic gate 502 and includes logic gate 506 having a first input coupled to output node 514 and a second input coupled to node 512, which is also coupled to the output of logic gate 508. The output of logic gate 506 is coupled to node 518, which is coupled to an input of logic gate 508 and to adjustable delay element 520.

Adjustable delay element 520 includes an inverter 522 having an input coupled to node 518 and an output coupled to an input of logic gate 524. A second input of logic gate 524 is configured to receive a pulse extension ("PE") signal for controlling a width of the PULSE signal output by pulse generator 500. The output logic gate 524 is provided to another input of logic gate 508, which receives a pulse mode ("PM") signal at another input.

The operation of pulse generator 500 is similar to the operation of pulse generator 100 except that signals PE and PM may be used to modify the output of pulse generator 500. The PM signal controls whether or not the output of pulse generator 500 tracks the input clock signal, CLK. For example, if the PM signal is a logic zero, then logic gate 508 will output a logic one regardless of what the other inputs are to logic gate 508.

With logic gate 508 constantly outputting a logic one to node 512, the output of logic gate 502 will oscillate as the CLK signal oscillates to provide the inverse signal of CLK. For example, if CLK is a logic one, then the output of logic gate 502 will be a logic zero, and if CLK is a logic zero, then the output of logic gate 502 will be a logic one. Inverter 516 inverts the output of logic gate 502, which is received at node 514, to provide the PULSE signal that has the same polarity as CLK and closely tracks, i.e., essentially outputs, the CLK signal. As will be understood by one skilled in the art, the PULSE signal will have the same frequency and pulse width as the CLK except that the PULSE signal will be delayed with respect to the CLK signal due to the delay attributed to the transitioning of logic gate 502 and inverter 516.

Figure 6:
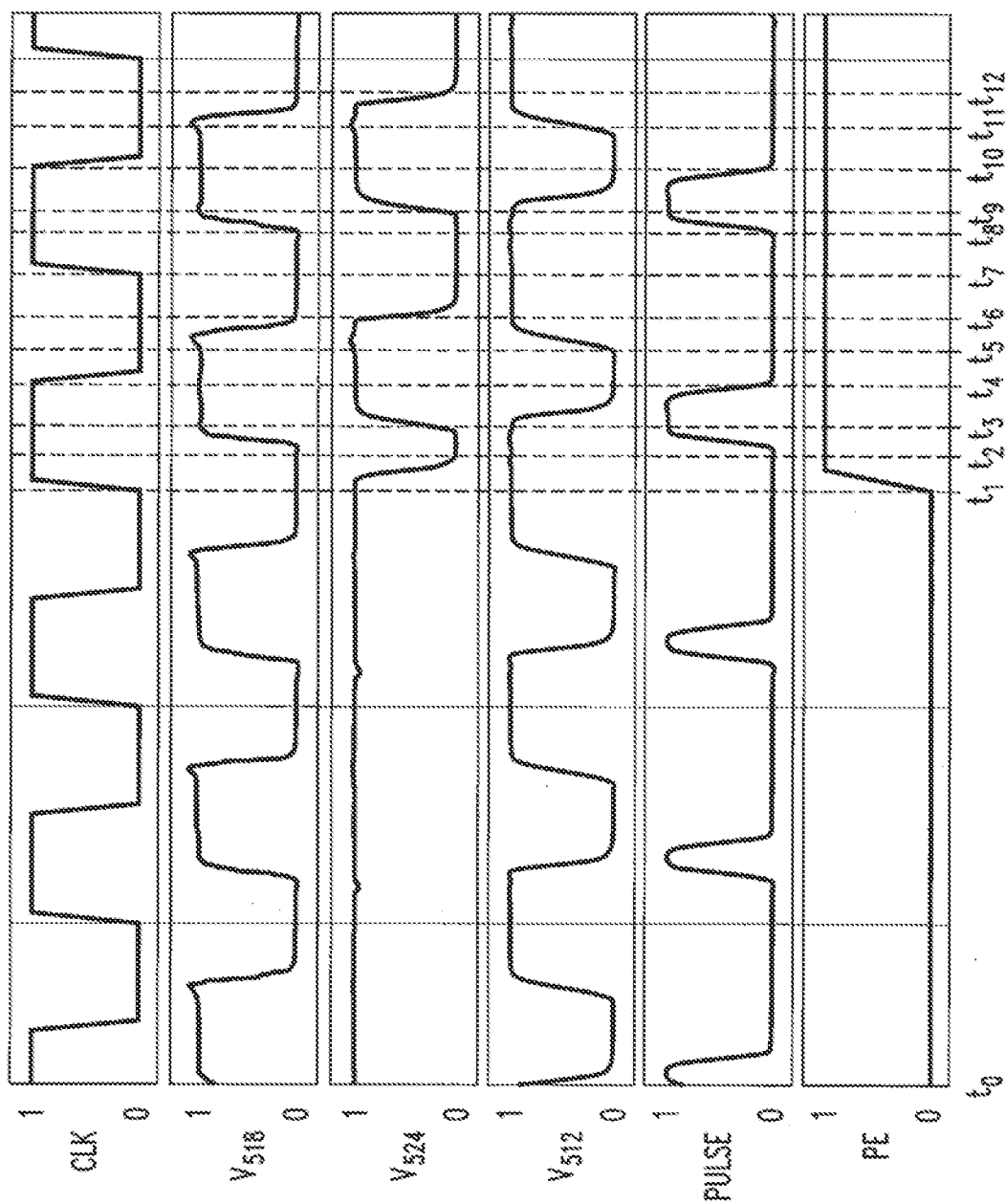
FIG. 6 is a timing diagram of various signals of the pulse generator circuit illustrated in FIG. 5.

In pulse mode, i.e., PM is a logic one, the PE signal may be used to adjust the pulse width of the PULSE signal as illustrated in FIG. 6. As shown in FIG. 6, the signals of pulse generator 500 oscillate as described above with respect to FIG. 2 between times $t_0$ and $t_1$ when PE is held at a logic zero. With PE a logic zero, the output of logic gate 524 will always be logic one regardless of the logic state of the other input received from inverter 522. The logic one output by logic gate 524, $V_{524}$, is provided to an input of logic gate 508 such that logic gate 508 receives logic ones at two of its four inputs. The other two inputs of logic gate 508 are the same inputs described above with respect to logic gate 108 such that pulse generator 500 operates in the same manner as pulse generator 100.

At time $t_1$, the PE signal transitions from a logic zero to a logic one, and the CLK signal transitions from a logic zero to a logic one. PE transitioning from logic zero to a logic one causes the output of logic gate 524, $V_{524}$, to transition from a logic one to a logic zero as both inputs of logic gate 524 are logic ones. The CLK signal transitioning from a logic zero to a logic one causes the output of logic gate 502, which is received at node 514, to transition from a logic one to a logic zero.

The voltage at node 514, $V_{514}$, transitioning to a logic zero causes the PULSE signal to transition from a logic zero to a logic one at time $t_2$. $V_{514}$ is also received at logic gate 506, which results in the voltage at node 518, $V_{518}$, to transition from logic zero to a logic one. The logic one at node 518 is received at an input of logic gate 508 and at the input of inverter 522. Inverter 522 inverts the logic one such that a logic zero is output to logic gate 524.

At time $t_3$, the logic zero at the input of logic gate 524 causes the output of logic gate 524, $V_{524}$, to transition from a logic zero to a logic one. The logic one output by logic gate 524 causes the output of logic gate 508, which is received at node 512, to transition from a logic one to a logic zero as each of the inputs of logic gate 508 is a logic one. The transition of $V_{512}$ from a logic one to a logic zero is received at the input of logic gate 502 causing logic gate 502 to change its output from a logic zero to a logic one.

At time $t_4$, the PULSE signal transitions from a logic one to a logic zero in response to inverter 516 receiving a logic zero at its input, which is coupled to node 514 to which the output of logic gate 502 is coupled. As can be seen in FIG. 6, the pulse widths of the PULSE signal between times $t_0$ and $t_1$ are narrower than the pulse width of the PULSE signal between times $t_3$ and $t_4$. The CLK signal also begins transitioning from a logic one to a logic zero at time $t_4$.

The CLK is supplied to an input of logic gate 502 and to an input of logic gate 508. In response to receiving the CLK signal, which is a logic zero, the output of logic gate 508 transitions from a logic zero to a logic one such that $V_{512}$ begins to transition from a logic zero to a logic one at time $t_5$ and logic gate 502 transitions from outputting a logic one to a logic zero. The logic one of $V_{512}$ is received at an input of logic gate 502 and at an input of logic gate 506. Logic gate 502 does not change its output in response to receiving the logic one from $V_{512}$, but logic gate 506 does change its output, which is coupled to node 518, from a logic one to a logic zero in response to receiving the logic one from $V_{512}$ shortly after time $t_5$.

The logic zero at node 518 is received at an input of logic gate 508 and is also provided to adjustable delay element 520. Logic gate 508 maintains its output of a logic one in response to receiving the logic zero from node 518. The logic zero from node 518 is received at the input of inverter 522 of adjustable delay element 520 causing inverter 522 to output a logic one to logic gate 524. With logic ones at both of its inputs, the output of logic gate 524, $V_{524}$, transitions from a logic one to a logic zero at time $t_6$.

Each of the signals in FIG. 6 maintain their respective voltages until CLK begins transitioning from a logic zero to a logic one at time $t_7$. At time $t_8$, pulse transitions from a logic zero to a logic one as described above with respect to time $t_2$. The signals CLK, $V_{512}$, $V_{518}$, $V_{524}$, and PULSE transition at times $t_9$, $t_{10}$, $t_{11}$, and $t_{12}$ in the same way as they respectively transition at times $t_3$, $t_4$, $t_5$, and $t_6$ to provide a PULSE signal having a pulse width that is wider than a pulse width when signal PE is asserted low.

The signals of CLK, PULSE, $V_{106}$, $V_{112}$, and $V_{114}$ transition in the manner at times $t_8$, $t_9$, and $t_{10}$ as they respectively transition at times $t_3$, $t_4$, and $t_5$. In this manner pulse generator 100 provides pulse signals $V_{114}$ and PULSE based on the CLK signal.

Figure 7:
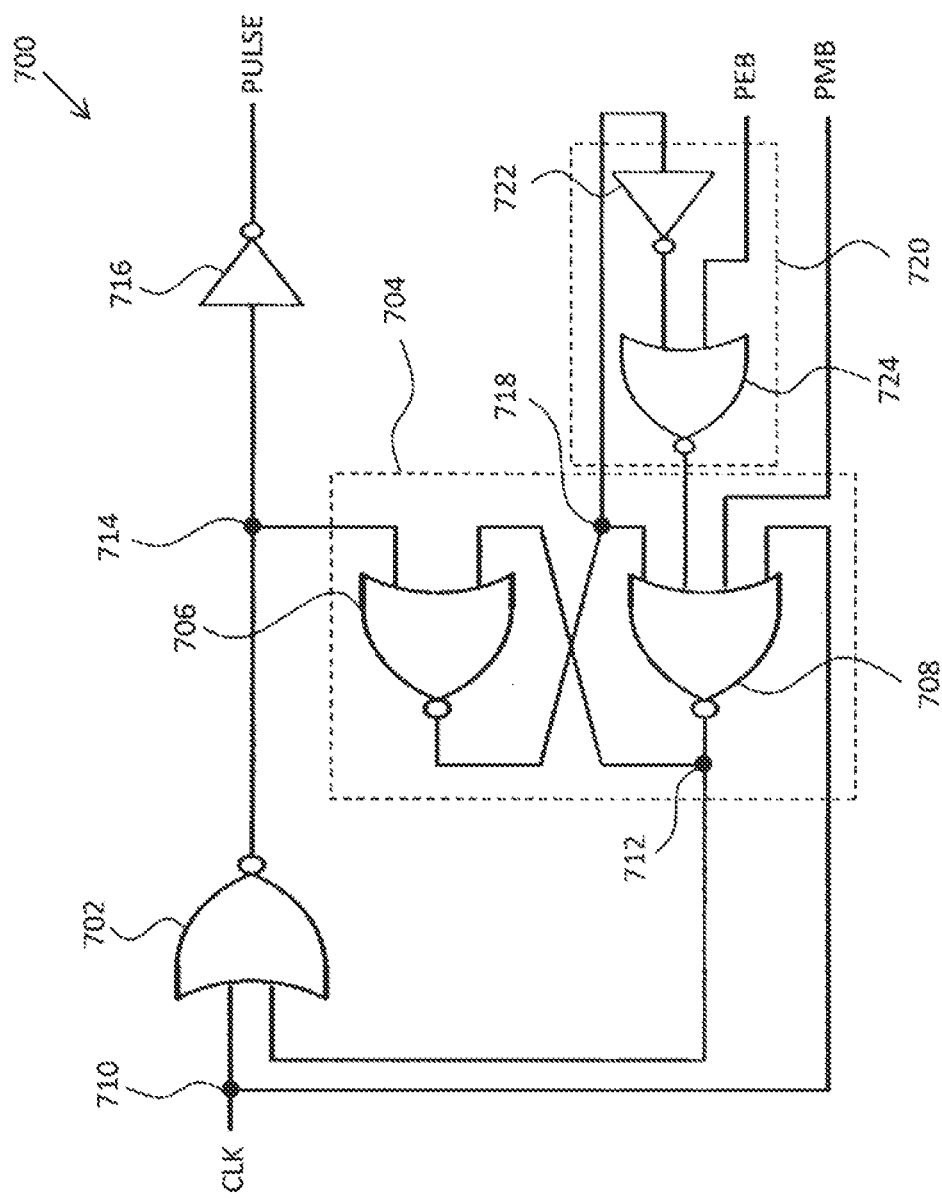
FIG. 7 illustrates another example of an improved pulse generator circuit.

FIG. 7 illustrates another example of a pulse generator 700 configured to modify or extend a pulse duration as well as to be selectively placed into a pulse mode (i.e., a mode in which the output of the pulse generator is different from the input clock signal) or non-pulse mode (i.e., a mode in which the output of the pulse generator follows the transition of the input clock signal). As shown in FIG. 7, pulse generator 700 includes a NOR gate 702 configured to receive a clock signal, CLK, at a first input and a feedback signal from latch 704 at a second input. The output of NOR gate 702 is coupled to node 714, which is coupled to latch 704 and to an input of optional inverter 716. The output of inverter 716 provides a PULSE signal.

Latch 704 includes NOR gate 706 having a first input coupled to node 714 and a second input coupled to node 712. The output of NOR gate 706 is coupled to node 718, which is coupled to an input of NOR gate 708 of latch 704 and to adjustable delay element 720. NOR gate 708 has an input coupled to the output of adjustable delay element 720, an input configured to receive a pulse mode ("PMB") signal, and another input configured to receive the CLK signal.

In some embodiments, adjustable delay element 720 includes an inverter having an input coupled to node 718 and an output coupled to an input of logic gate 724. Logic gate 724 has a second input configured to receive a pulse extension ("PEB") signal and an output coupled to an input of logic gate 708.

The operation of pulse generator 700 is similar to the operation of pulse generator 500 except that signals PEB and PMB may be used to modify the output of pulse generator 700. The PMB signal controls whether or not the output of pulse generator 700 tracks the input clock signal, CLK. For example, if the PMB signal is a logic one, then logic gate 708 will output a logic zero regardless of what the other inputs are to logic gate 708.

With logic gate 708 constantly outputting a logic zero to node 712, the output of logic gate 702 will oscillate as the CLK signal oscillates to provide the inverse signal of CLK. For example, if CLK is a logic one, then the output of logic gate 702 will be a logic zero, and if CLK is a logic zero, then the output of logic gate 702 will be a logic one. Inverter 716 inverts the output of logic gate 702, which is received at node 714, to provide the PULSE signal that has the same polarity as CLK and closely tracks the CLK signal. As will be understood by one skilled in the art, the PULSE signal will have a slight delay compared to the CLK that is attributed to the transitioning of logic gate 702 and inverter 716.

Figure 8:
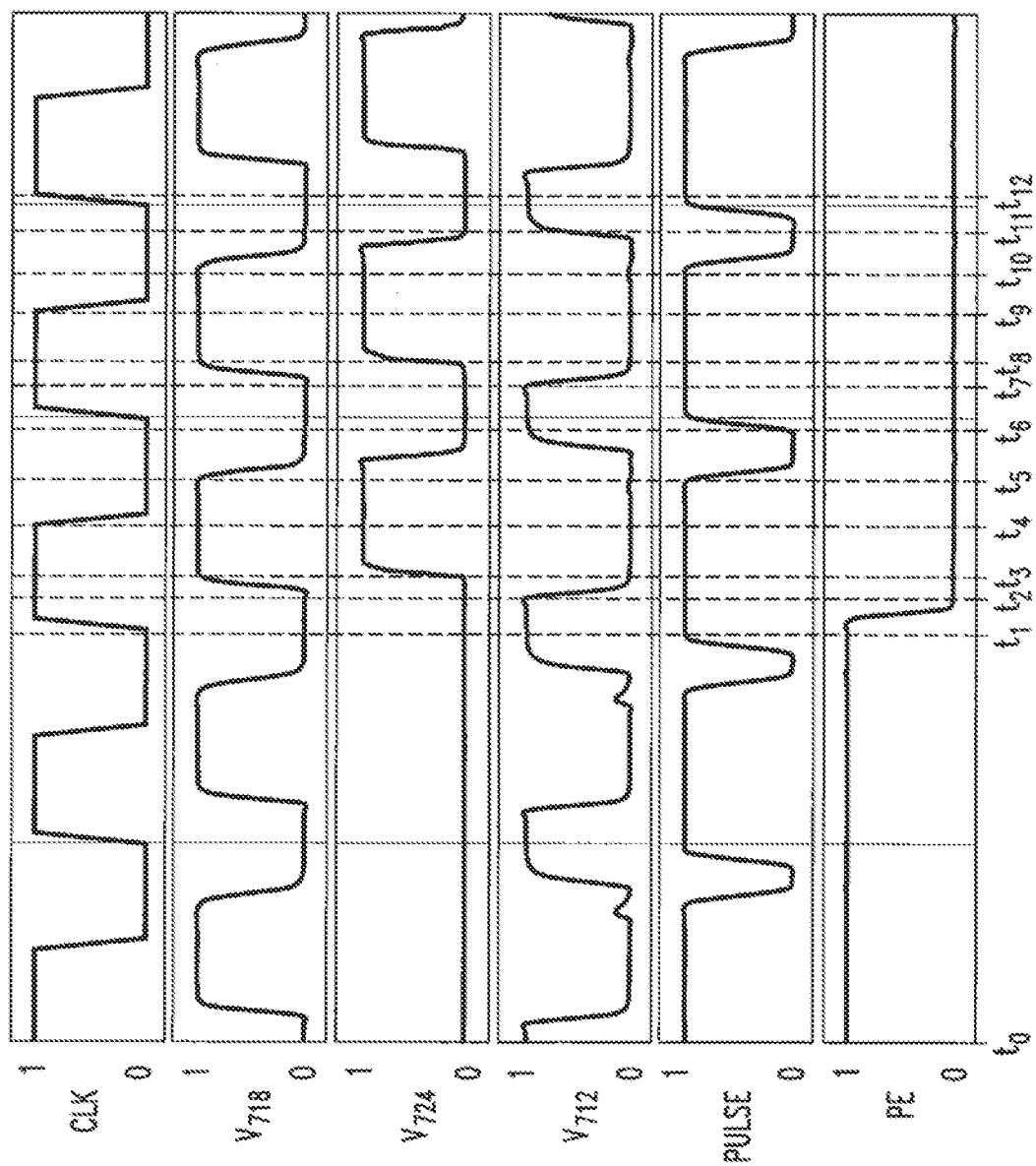
FIG. 8 is a timing diagram of various signals of the pulse generator circuit illustrated in FIG. 7.

In pulse mode, i.e., PMB is a logic zero, the PEB signal may be used to adjust the pulse width of the PULSE signal as illustrated in FIG. 8. As shown in FIG. 8, the signals of pulse generator 700 oscillate in a similar manner as described above with respect to FIG. 4 between times $t_0$ and $t_1$ when PEB is held at a logic one. The difference between the signals in FIG. 4 and FIG. 8 is that the PULSE signal in FIG. 8 is inverted.

With PEB a logic one, the output of logic gate 724 will always be logic zero regardless of the logic state of the other input received from inverter 722. The logic zero output by logic gate 724, $V_{724}$, is provided to an input of logic gate 708 such that logic gate 708 receives logic zeroes at two of its four inputs. The other two inputs of logic gate 708 are the same inputs described above with respect to logic gate 308 such that pulse generator 700 operates in the same manner as pulse generator 300 with the PULSE signal output by inverter 716 being inverted.

At time $t_1$, the PEB signal transitions from a logic one to a logic zero, and the CLK signal transitions from a logic zero to a logic one. PEB transitioning from logic one to a logic zero does not change the output of logic gate 724, $V_{724}$. The CLK signal transitioning from a logic zero to a logic one does not immediately cause the output of logic gate 702, which is received at node 714, to change its logic level.

The CLK signal is also received at an input of logic gate 708, which changes the logic level of its output in response at time $t_2$. Logic gate 708 transitions from outputting a logic one to outputting a logic zero to node 712. The logic zero at node 712, $V_{712}$, is provided to an input of logic gate 702 and to an input of logic gate 706. Logic gate 702 does not change its output in response to receiving the logic zero from node 712, but the output of logic gate 706, which is provided to node 718, i.e., $V_{718}$, transitions from a logic zero to a logic one as both inputs of logic gate 706 are logic zeroes.

Inverter 722 outputs a logic zero to logic gate 724 in response to receiving a logic one from node 718. The output of logic gate 724, $V_{724}$, transitions from outputting a logic zero to logic gate 708 to outputting a logic one to logic gate 708 at time $t_3$. At time $t_4$, the CLK signal transitions from a logic one to a logic zero. The transition of CLK from a logic one to a logic zero results in logic gate 702 changing its output such that the voltage at node 714, $V_{714}$, is increased from a logic zero to a logic one.

At time $t_5$, the logic one at node 714 is inverted by inverter 716 such that the PULSE signal is pulled down from a logic one to a logic zero. Additionally, logic gate 706 changes its output in response to $V_{714}$ transitioning from a logic zero to a logic one such that the voltage at node 718, $V_{718}$, is pulled down from a logic one to a logic zero. The logic zero at node 718 is provided to an input of logic gate 708 and to the input of inverter 722 of adjustable delay device 720. Inverter 722 inverts the logic zero and provides a logic one to an input of logic gate 724, which receives the logic zero of the PEB signal at the other input. Shortly after time $t_5$, the output of logic gate 724, $V_{724}$, transitions from a logic one to a logic zero in response to the logic one received at its input.

The logic zero output from logic gate 724 is received at an input of logic gate 708 and causes logic gate 708 to change its output, which is coupled to node 712, from a logic zero to a logic one. The logic one at node 712 is provided to an input of logic gate 706 and to an input of logic gate 702. Logic gate 706 does not change its output in response to receiving the logic one from node 712, but logic gate 702 changes its output from a one to a logic zero as logic gate 702 also receives a logic zero from CLK. The logic zero output by logic gate 702 is received at node 714, which causes inverter 716 to output a logic one as the PULSE signal at time $t_6$. At approximately the same time, CLK also transitions to a logic one, which does not affect the output of logic gate 702.

At time $t_7$, the voltage at node 712 transitions from a logic one to a logic zero in response to the CLK signal being received at an input of logic gate 708. The logic zero at node 712, $V_{712}$, is received at an input of logic gate 706, which receives a logic zero at its other input from node 714. The logic zeroes at the inputs of the logic gate 706 causes logic gate 706 to output a logic one to node 718. As described above, logic gate 708 has an input coupled to node 718 as does inverter 722. The output state of logic gate 708 is not changed in response to receiving the logic one from node 718.

At time $t_8$, the output of logic gate 724, $V_{724}$, transitions from a logic zero to a logic one in response to receiving a logic zero from inverter 722. Inverter 722 provides the logic zero to logic gate 724 in response to receiving the logic one from node 718. The signal levels are maintained until CLK transitions from a logic one to a logic zero at time $t_9$.

The transition of CLK to logic zero causes logic gate 702 to change its output from a logic zero to a logic one, which results in the PULSE signal transitioning to a logic zero at time $t_{10}$. The voltages and signals $V_{712}$, $V_{718}$, $V_{724}$, and PULSE transition in the same way at time $t_{10}$ as they transitioned at time $t_5$. The signals and voltages CLK, $V_{712}$, $V_{718}$, $V_{724}$, and PULSE transition at times $t_{11}$ and $t_{12}$ in the manner as they respectively transition at times $t_6$ and $t_7$ to provide a PULSE signal having a pulse width that is wider than a pulse width when signal PE is asserted low.

In some embodiments, a circuit includes a logic gate and a latch. The logic gate is configured to receive a clock signal at a first input. The latch is disposed in a feedback loop of the logic gate and is configured to output a feedback signal to a second input of the logic gate in response to a signal output by the logic gate and the clock signal. The circuit is configured to output a pulsed signal based on one of a rising edge or a falling edge of the clock signal.

In some embodiments, a circuit includes a first logic gate configured to receive a clock signal at a first input. A latch includes second and third logic gates. The second logic gate includes a first input coupled to an output of the first logic gate and to a second input of the first logic gate, and a second input coupled to an output of the third logic gate. The third logic gate includes a first input coupled to an output of the second logic gate, and a second input configured to receive the clock signal. The circuit is configured to output a pulsed signal based on one of a rising edge or a falling edge of the clock signal.

The improved pulse generation circuits and methods disclosed herein operate at low voltages, e.g., less than 0.7 volts, even in response to receiving ill-defined clock signals, i.e., clock signals having moderate slopes that define the pulse width. In simulations, the improved pulse generation circuits described herein have reliably performed with operating voltages as low as 0.55 volts with 5 percent and 95 percent duty cycles of the input clock signals. With input clock duty cycles of approximately 50 percent, the disclosed embodiments have reliably operated during simulations with operating voltages as low as 0.4 volts. In addition to being more reliable than conventional pulse generator circuits, the disclosed pulse generators may also be configured to track the input clock signal or to adjust a pulse width of the pulsed output signal.

Although the circuits and methods have been described in terms of exemplary embodiments, they are not limited thereto. Rather, the appended claims should be construed broadly, to include other variants and embodiments of the circuits and methods, which may be made by those skilled in the art without departing from the scope and range of equivalents of the circuits and methods.

What is claimed is:

1. A circuit, comprising:
   a first logic gate configured to receive a clock signal at a first input; and
   a latch disposed in a feedback loop of the first logic gate, the latch configured to output a feedback signal to a second input of the first logic gate in response to a signal output by the first logic gate and the clock signal,
   wherein the circuit is configured to output a pulsed signal based on one of a rising edge or a falling edge of the clock signal.

2. The circuit of claim 1, wherein the latch includes a second logic gate that is cross-coupled to a third logic gate.

3. The circuit of claim 2, wherein the first, second, and third logic gates are NAND gates.

4. The circuit of claim 2, wherein the first, second, and third logic gates are NOR gates.

5. The circuit of claim 2, wherein
   the second logic gate includes:
      a first input coupled to an input of the first logic gate, and
      a second input coupled to an output of the third logic gate and to an input of the first logic gate; and
   the third logic gate includes:
      a first input coupled to an output of the second logic gate, and
      a second input configured to receive the clock signal.

6. The circuit of claim 5, wherein the third logic gate includes a third input configured to receive a pulse mode signal for switching the circuit between a first mode in which the pulsed signal output tracks the clock signal and a second mode in which the pulsed signal differs from the clock signal.

7. The circuit of claim 5, further comprising an adjustable delay element coupled to the latch.

8. The circuit of claim 7, wherein the adjustable delay element includes:
   an inverter having an input coupled to the output of the second logic gate; and
   a fourth logic gate having a first input coupled to an output of the inverter, an output coupled to a third input of the third logic gate, and a second input configured to receive a pulse enable signal for adjusting a pulse width of the pulsed signal output by the circuit.

9. The circuit of claim 7, wherein the third logic gate includes a fourth input configured to receive a pulse mode signal for switching the circuit between a first mode in which the pulsed signal output tracks the clock signal and a second mode in which the pulsed signal differs from the clock signal.

10. The circuit of claim 1, further comprising an inverter coupled to an output of the first logic gate.

11. A circuit, comprising:
    a first logic gate configured to receive a clock signal at a first input; and
    a latch including second and third logic gates,
    the second logic gate including:
       a first input coupled to an output of the first logic gate and to a second input of the first logic gate, and
       a second input coupled to an output of the third logic gate;
    the third logic gate including:
       a first input coupled to an output of the second logic gate, and
       a second input configured to receive the clock signal,
    wherein the circuit is configured to output a pulsed signal based on one of a rising edge or a falling edge of the clock signal.

12. The circuit of claim 11, wherein the first, second, and third logic gates are NAND gates.

13. The circuit of claim 11, wherein the first, second, and third logic gates are NOR gates.

14. The circuit of claim 11, further comprising an inverter coupled to an output of the first logic gate and configured to output the pulsed signal.

15. The circuit of claim 11, wherein the third logic gate includes a third input configured to receive a pulse mode signal for switching the circuit between a first mode in which the pulsed signal output tracks the clock signal and a second mode in which the pulsed signal differs from the clock signal.

16. The circuit of claim 11, further comprising an adjustable delay element coupled to a third input of the third logic gate, the adjustable delay element configured to adjust a pulse width of the pulsed signal in response to a pulse enable signal.

17. The circuit of claim 16, wherein the adjustable delay element includes:
    an inverter having an input coupled to the output of the second logic gate; and
    a fourth logic gate having a first input coupled to an output of the inverter, a second input configured to receive the pulse enable signal, and an output coupled to a third input of the third logic gate.

18. The circuit of claim 17, wherein the third logic gate includes a fourth input at which the third logic gate receives a pulse mode signal for switching the circuit between a first mode in which the pulsed signal output tracks the clock signal and a second mode in which the pulsed signal differs from the clock signal.

19. The circuit of claim 18, further comprising a second inverter coupled to an output of the first logic gate, the second inverter configured to output the pulsed signal.

* * * * *